(12) United States Patent
Hiyoshi et al.

(10) Patent No.: US 11,011,631 B2
(45) Date of Patent: May 18, 2021

(54) SILICON CARBIDE SEMICONDUCTOR DEVICE

(71) Applicant: Sumitomo Electric Industries, Ltd., Osaka (JP)

(72) Inventors: Toru Hiyoshi, Osaka (JP); Kosuke Uchida, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/628,473

(22) PCT Filed: Apr. 26, 2018

(86) PCT No.: PCT/JP2018/016950
§ 371 (c)(1),
(2) Date: Jan. 3, 2020

(87) PCT Pub. No.: WO2019/008884
PCT Pub. Date: Jan. 10, 2019

(65) Prior Publication Data
US 2020/0185519 A1  Jun. 11, 2020

(30) Foreign Application Priority Data

Jul. 4, 2017  (JP) .............................. JP2017-131331

(51) Int. Cl.
*H01L 29/78* (2006.01)
*H01L 29/06* (2006.01)
(Continued)

(52) U.S. Cl.
CPC ...... *H01L 29/7811* (2013.01); *H01L 29/0623* (2013.01); *H01L 29/1095* (2013.01); *H01L 29/1608* (2013.01); *H01L 29/7813* (2013.01)

(58) Field of Classification Search
CPC ......... H01L 29/06; H01L 29/10; H01L 29/16; H01L 29/739; H01L 29/0623;
(Continued)

(56) References Cited

U.S. PATENT DOCUMENTS

| | | |
|---|---|---|
| 6,426,520 B1 | 7/2002 | Traijkovic et al. |
| 2008/0001159 A1 | 1/2008 | Ota et al. |

(Continued)

FOREIGN PATENT DOCUMENTS

| | | |
|---|---|---|
| JP | 10-173174 A | 6/1998 |
| JP | 2001-523895 A | 11/2001 |

(Continued)

*Primary Examiner* — Chuong A Luu
(74) *Attorney, Agent, or Firm* — Baker Botts L.L.P.; Michael A. Sartori (57) ABSTRACT

A silicon carbide substrate has at least one of a first structure and a second structure. The first structure is such that a first impurity region is in contact with a second impurity region, a third impurity region is separated from a fourth impurity region by a second drift region, and the second impurity region has a width greater than a width of the fourth impurity region in a direction parallel to a first main surface. The second structure is such that the first impurity region is separated from the second impurity region by a first drift region, the third impurity region is in contact with the fourth impurity region, and the fourth impurity region has a width greater than a width of the second impurity region in the direction parallel to the first main surface.

21 Claims, 9 Drawing Sheets

(51) Int. Cl.
   *H01L 29/10*         (2006.01)
   *H01L 29/16*         (2006.01)

(58) Field of Classification Search
   CPC ............. H01L 29/0615; H01L 29/0638; H01L 29/0657; H01L 29/1095; H01L 29/1608; H01L 29/7811; H01L 29/7813; H01L 29/7801; H01L 29/7397; H01L 29/66674
   USPC .......................................... 257/77
   See application file for complete search history.

(56) References Cited

U.S. PATENT DOCUMENTS

| | | | |
|---|---|---|---|
| 2009/0236683 A1* | 9/2009 | Williams | H01L 29/0646 257/510 |
| 2014/0252374 A1 | 9/2014 | Wada et al. | |
| 2015/0372128 A1 | 12/2015 | Wada et al. | |
| 2016/0027869 A1* | 1/2016 | Chan | H01L 21/823878 257/510 |
| 2016/0099310 A1* | 4/2016 | Tsuchiko | H01L 21/823493 257/501 |
| 2017/0062610 A1* | 3/2017 | Agam | H01L 29/0653 |

FOREIGN PATENT DOCUMENTS

| | | |
|---|---|---|
| JP | 2008-016461 A | 1/2008 |
| JP | 2014-139967 A | 7/2014 |
| JP | 2014-175518 A | 9/2014 |
| WO | 99/26296 A2 | 5/1999 |

* cited by examiner

SILICON CARBIDE SEMICONDUCTOR DEVICE

TECHNICAL FIELD

The present disclosure relates to a silicon carbide semiconductor device. The present application claims priority to Japanese Patent Application No. 2017-131331 filed on Jul. 4, 2017, the entire contents of which are incorporated herein by reference.

BACKGROUND ART

Japanese Patent Laying-Open No. 2014-139967 (PTL 1) discloses a trench type MOSFET (Metal Oxide Semiconductor Field Effect Transistor). This trench type MOSFET has a surface guard ring region and an embedded guard ring region provided at its peripheral termination portion.

CITATION LIST

Patent Literature

PTL 1: Japanese Patent Laying-Open No. 2014-139967

SUMMARY OF INVENTION

A silicon carbide semiconductor device according to the present disclosure includes a silicon carbide substrate and a source electrode. The silicon carbide substrate has a first main surface and a second main surface opposite to the first main surface. The source electrode is provided on the first main surface. The silicon carbide substrate includes a first silicon carbide layer, and a second silicon carbide layer provided on the first silicon carbide layer and constituting the first main surface. The first silicon carbide layer has a first drift region having a first conductivity type, a first impurity region having a second conductivity type different from the first conductivity type, and a second impurity region having the second conductivity type and surrounding the first impurity region as seen in a direction perpendicular to the first main surface. The second silicon carbide layer has a second drift region having the first conductivity type, a third impurity region having the second conductivity type and facing the first impurity region with the second drift region interposed therebetween, and a fourth impurity region having the second conductivity type, facing the second impurity region with the second drift region interposed therebetween, and surrounding the third impurity region as seen in the direction perpendicular to the first main surface. A first conductivity type impurity in the second drift region has a concentration higher than a concentration of a first conductivity type impurity in the first drift region. The third impurity region is electrically connected to the source electrode. The silicon carbide substrate has at least one of a first structure and a second structure. The first structure is such that the first impurity region is in contact with the second impurity region, the third impurity region is separated from the fourth impurity region by the second drift region, and the second impurity region has a width greater than a width of the fourth impurity region in a direction parallel to the first main surface. The second structure is such that the first impurity region is separated from the second impurity region by the first drift region, the third impurity region is in contact with the fourth impurity region, and the fourth impurity region has a width greater than a width of the second impurity region in the direction parallel to the first main surface.

DETAILED DESCRIPTION

[Summary of Embodiment of the Present Disclosure]

A summary of an embodiment of the present disclosure is provided first. Regarding crystallographic indications herein, an individual orientation is represented by [ ], a group orientation is represented by < >, an individual plane is represented by ( ), and a group plane is represented by { }. In addition, a negative crystallographic index is normally expressed by putting "–" (bar) above a numeral, but is herein expressed by putting the negative sign before the numeral.

(1) A silicon carbide semiconductor device 100 according to the present disclosure includes a silicon carbide substrate 40 and a source electrode 51. Silicon carbide substrate 40 has a first main surface 1 and a second main surface 2 opposite to first main surface 1. Source electrode 51 is provided on first main surface 1. Silicon carbide substrate 40 includes a first silicon carbide layer 10, and a second silicon carbide layer 20 provided on first silicon carbide layer 10 and constituting first main surface 1. First silicon carbide layer 10 has a first drift region 13 having a first conductivity type, a first impurity region 11 having a second conductivity type different from the first conductivity type, and a second impurity region 12 having the second conductivity type and surrounding first impurity region 11 as seen in a direction perpendicular to first main surface 1. Second silicon carbide layer 20 has a second drift region 23 having the first conductivity type, a third impurity region 21 having the second conductivity type and facing first impurity region 11 with second drift region 23 interposed therebetween, and a fourth impurity region 22 having the second conductivity type, facing second impurity region 12 with second drift region 23 interposed therebetween, and surrounding third impurity region 21 as seen in the direction perpendicular to first main surface 1. A first conductivity type impurity in second drift region 23 has a concentration higher than a concentration of a first conductivity type impurity in first drift region 13. Third impurity region 21 is electrically connected to source electrode 51. Silicon carbide substrate 40 has at least one of a first structure and a second structure. The first structure is such that first impurity region 11 is in contact with second impurity region 12, third impurity region 21 is separated from fourth impurity region 22 by second drift region 23, and second impurity region 12 has a width greater than a width of fourth impurity region 22 in a direction parallel to first main surface 1. The second structure is such that first impurity region 11 is separated from second impurity region 12 by first drift region 13, third impurity region 21 is in contact with fourth impurity region 22, and fourth impurity region 22 has a width greater than a width of second impurity region 12 in the direction parallel to first main surface 1.

According to silicon carbide semiconductor device 100 of (1), voltage is distributed throughout an outer peripheral structure (second impurity region 12 and fourth impurity region 22). Thus, breakdown voltage can be maintained over a wide range of impurity concentration. In other words, variation in the breakdown voltage can be suppressed.

(2) In silicon carbide semiconductor device 100 according to (1), silicon carbide substrate 40 may have the first structure. Thereby, variation in the breakdown voltage can be suppressed.

(3) In silicon carbide semiconductor device 100 according to (2), fourth impurity region 22 may include one or more guard rings. Thereby, the voltage is further distributed throughout the outer peripheral structure.

(4) In silicon carbide semiconductor device 100 according to (2) or (3), the width of second impurity region 12 in the direction parallel to first main surface 1 may be two or more times greater than a sum of a thickness of first silicon carbide layer 10 and a thickness of second silicon carbide layer 20.

(5) In silicon carbide semiconductor device 100 according to any one of (2) to (4), fourth impurity region 22 may be floating. Thereby, the voltage is further distributed throughout the outer peripheral structure.

(6) In silicon carbide semiconductor device 100 according to any one of (2) to (5), first impurity region 11 may be floating.

(7) In silicon carbide semiconductor device 100 according to any one of (2) to (5), first impurity region 11 may be electrically connected to source electrode 51.

(8) In silicon carbide semiconductor device 100 according to any one of (2) to (4), each of first impurity region 11, second impurity region 12 and fourth impurity region 22 may be electrically connected to source electrode 51.

(9) In silicon carbide semiconductor device 100 according to any one of (2) to (8), a dose amount of a second conductivity type impurity in second impurity region 12 may be not less than $0.4 \times 10^{13}$ cm$^{-2}$ and not more than $2.0 \times 10^{13}$ cm$^{-2}$.

(10) In silicon carbide semiconductor device 100 according to any one of (2) to (9), a dose amount of a second conductivity type impurity in fourth impurity region 22 may be not less than $0.4 \times 10^{13}$ cm$^{-2}$ and not more than $2.0 \times 10^{13}$ cm$^{-2}$.

(11) In silicon carbide semiconductor device 100 according to (1), silicon carbide substrate 40 may have the second structure. Thereby, variation in the breakdown voltage can be suppressed.

(12) In silicon carbide semiconductor device 100 according to (11), second impurity region 12 may include one or more guard rings. Thereby, the voltage is further distributed throughout the outer peripheral structure.

(13) In silicon carbide semiconductor device 100 according to (11) or (12), the width of fourth impurity region 22 in the direction parallel to first main surface 1 may be two or more times greater than a sum of a thickness of first silicon carbide layer 10 and a thickness of second silicon carbide layer 20.

(14) In silicon carbide semiconductor device 100 according to any one of (11) to (13), second impurity region 12 may be floating. Thereby, the voltage is further distributed throughout the outer peripheral structure.

(15) In silicon carbide semiconductor device 100 according to any one of (11) to (14), first impurity region 11 may be floating.

(16) In silicon carbide semiconductor device 100 according to any one of (11) to (14), first impurity region 11 may be electrically connected to source electrode 51.

(17) In silicon carbide semiconductor device 100 according to any one of (11) to (13), each of first impurity region 11 and second impurity region 12 may be electrically connected to source electrode 51.

(18) In silicon carbide semiconductor device 100 according to any one of (11) to (17), a dose amount of a second conductivity type impurity in fourth impurity region 22 may be not less than $0.4 \times 10^{13}$ cm$^{-2}$ and not more than $2.0 \times 10^{13}$ cm$^{-2}$.

(19) In silicon carbide semiconductor device 100 according to any one of (11) to (18), a dose amount of a second conductivity type impurity in second impurity region 12 may be not less than $0.4 \times 10^{13}$ cm$^{-2}$ and not more than $2.0 \times 10^{13}$ cm$^{-2}$.

(20) In silicon carbide semiconductor device 100 according to any one of (1) to (19), the first conductivity type impurity in first drift region 13 may have a concentration of not less than $5 \times 10^{13}$ cm$^{-3}$ and not more than $1 \times 10^{16}$ cm$^{-3}$. Thereby, the breakdown voltage can be maintained at high level while on-resistance is kept at low level.

(21) In silicon carbide semiconductor device 100 according to any one of (1) to (20), the first conductivity type impurity in second drift region 23 may have a concentration of not less than $5 \times 10^{15}$ cm$^{-3}$ and not more than $1 \times 10^{18}$ cm$^{-3}$. The on-resistance tends to decrease, however, the breakdown voltage tends to decrease, as the concentration of the first conductivity type impurity in second drift region 23 is increased. According to silicon carbide semiconductor device 100 of (19), the breakdown voltage can be maintained at high level while the on-resistance is kept at low level.

[Details of Embodiment of the Present Disclosure]

An embodiment is now described based on the drawings. The same or corresponding components are designated by the same reference numbers in the following drawings, and description thereof will not be repeated.

First Embodiment

First, a configuration of a MOSFET 100 as an example of a silicon carbide semiconductor device according to a first embodiment is described.

Figure 1:
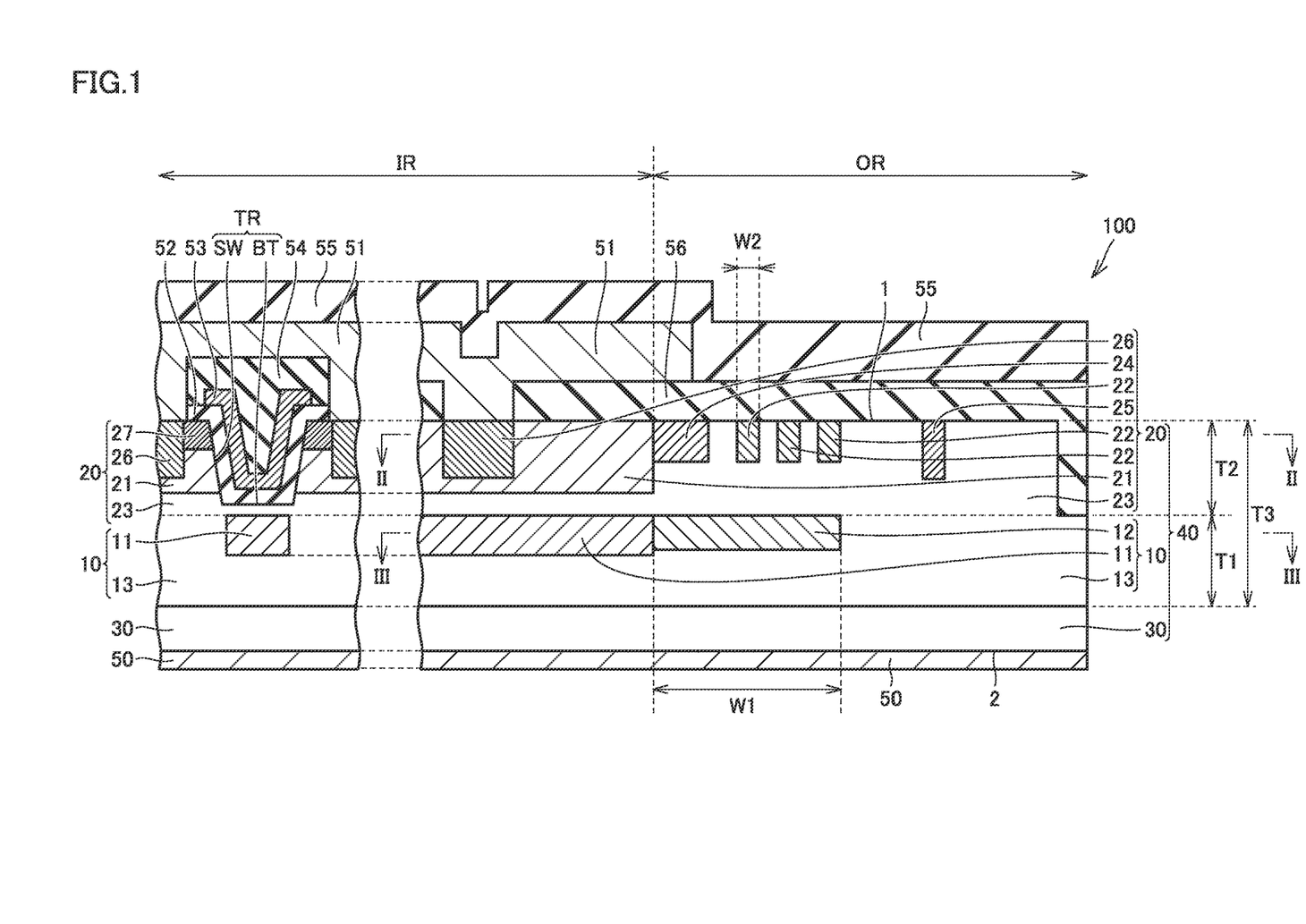
FIG. 1 is a schematic sectional view showing a configuration of a silicon carbide semiconductor device according to a first embodiment.

As shown in FIG. 1, MOSFET 100 according to the first embodiment mainly has a silicon carbide substrate 40, a gate insulating film 52, a gate electrode 53, an interlayer insulating film 54, a source electrode 51, a drain electrode 50, a first insulating film 55, and a second insulating film 56. Silicon carbide substrate 40 includes a silicon carbide single-crystal substrate 30, a first silicon carbide layer 10, and a second silicon carbide layer 20. Silicon carbide substrate 40 has a first main surface 1 and a second main surface 2 opposite to first main surface 1. Second silicon carbide layer 20 constitutes first main surface 1. Silicon carbide single-crystal substrate 30 constitutes second main surface 2. Silicon carbide single-crystal substrate 30, first silicon carbide layer 10, and second silicon carbide layer 20 are made of hexagonal silicon carbide having a polytype of 4H, for example. Silicon carbide single-crystal substrate 30 includes an n type impurity such as nitrogen (N), and has n type (first conductivity type).

First main surface 1 of silicon carbide substrate 40 has a maximum diameter of not less than 100 mm, for example. First main surface 1 may have a maximum diameter of not less than 150 mm, or not less than 200 mm. First main surface 1 is, for example, a {0001} plane, or a plane inclined at an off angle of not more than 8° in an off direction relative to the {0001} plane. Specifically, first main surface 1 may be, for example, a (000-1) plane, or a plane inclined at an off angle of not more than 8° in an off direction relative to the (000-1) plane. The off direction may be a <11-20> direction or a <1-100> direction, for example. The off angle may be not less than 1° or not less than 2°, for example. The off angle may be not more than 6° or not more than 4°.

First silicon carbide layer 10 has a first drift region 13, a first impurity region 11, and a second impurity region 12. First drift region 13 includes an n type impurity such as nitrogen (N), and has n type (first conductivity type). First impurity region 11 includes a p type impurity such as aluminum (Al) or boron (B), and has p type (second conductivity type) different from the n type. Second impurity region 12 includes a p type impurity such as aluminum (Al) or boron (B), and has p type (second conductivity type). Second impurity region 12 is a JTE (Junction Termination Extension) region, for example.

A dose amount of the p type impurity (second conductivity type impurity) in second impurity region 12 is not less than $0.4 \times 10^{13}$ cm$^{-2}$ and not more than $2.0 \times 10^{13}$ cm$^{-2}$, for example. A dose amount in this range is useful for relaxing an electric field. That is, when the dose amount is less than $0.4 \times 10^{13}$ cm$^{-2}$, second impurity region 12 is too low in concentration, resulting in a lack of electric charge required to deplete a drift layer. When the dose amount exceeds $2.0 \times 10^{13}$ cm$^{-2}$, second impurity region 12 is not depleted since the dose amount is too high, so that an electric field drop does not occur in second impurity region 12. A dose amount of the p type impurity in first impurity region 11 may be equal to the dose amount of the p type impurity in second impurity region 12. The equal dose amounts allow complete depletion of first impurity region 11 and second impurity region 12, to improve breakdown voltage. The dose amount of the p type impurity in first impurity region 11 may be different from the dose amount of the p type impurity in second impurity region 12.

First impurity region 11 may be floating, for example. First impurity region 11 may be electrically insulated from source electrode 51. Conversely, first impurity region 11 may be electrically connected to source electrode 51. First impurity region 11 is preferably connected to source electrode 51 with a p type impurity region (not shown) interposed therebetween, for example, so as to further improve the breakdown voltage of an outer peripheral structure. Second impurity region 12 is preferably connected to source electrode 51 with first impurity region 11 interposed therebetween, so as to further improve the breakdown voltage of the outer peripheral structure. A fourth impurity region 22 may be floating, for example. Fourth impurity region 22 may be electrically insulated from source electrode 51. Conversely, fourth impurity region 22 is preferably electrically connected to source electrode 51, so as to further improve the breakdown voltage of the outer peripheral structure. The term "floating" generally refers to a state in which the potential of a certain region is not directly fixed by an electrode.

Second silicon carbide layer 20 is provided on first silicon carbide layer 10. Second silicon carbide layer 20 has a second drift region 23, a third impurity region 21, fourth impurity region 22, a fifth impurity region 24, and a field stop region 25. Second drift region 23 includes an n type impurity such as nitrogen (N), and has n type (first conductivity type). Third impurity region 21 includes a p type impurity such as aluminum (Al) or boron (B), and has a p type (second conductivity type). Third impurity region 21 faces first impurity region 11 with second drift region 23 interposed therebetween. Fourth impurity region 22 includes a p type impurity such as aluminum (Al) or boron (B), and has p type. Fourth impurity region 22 faces second impurity region 12 with second drift region 23 interposed therebetween. Fifth impurity region 24 includes a p type impurity such as aluminum (Al) or boron (B), and has p type. Fifth impurity region 24 is in contact with third impurity region 21. Field stop region 25 includes an n type impurity such as nitrogen (N), and has n type (first conductivity type).

The p type impurity (second conductivity type impurity) in third impurity region 21 has a concentration of not less than $1.0 \times 10^{16}$ cm$^{-3}$ and not more than $1.0 \times 10^{19}$ cm$^{-3}$, for example. A dose amount of the p type impurity in fourth impurity region 22 is not less than $0.4 \times 10^{13}$ cm$^{-2}$ and not more than $2.0 \times 10^{13}$ cm$^{-2}$, for example. The p type impurity in fifth impurity region 24 may have a concentration equal to or different from the concentration of the p type impurity in fourth impurity region 22.

The n type impurity (first conductivity type impurity) in first drift region 13 has a concentration of not less than $5 \times 10^{13}$ cm$^{-3}$ and not more than $1 \times 10^{16}$ cm$^{-3}$, for example. This is a useful range for realizing a breakdown voltage of not less than 600 V and not more than 20 kV which is considered necessary for a power device.

The n type impurity in second drift region 23 has a concentration higher than the concentration of the n type impurity in first drift region 13. The n type impurity (first conductivity type impurity) in second drift region 23 has a concentration of not less than $5 \times 10^{15}$ cm$^{-3}$ and not more than $1 \times 10^{18}$ cm$^{-3}$, for example. When the concentration is less than $5 \times 10^{15}$ cm$^{-3}$, on-resistance will be too high. When the concentration exceeds $1 \times 10^{18}$ cm$^{-3}$, an oxide film electric field will be too high. The n type impurity (first conductivity type impurity) in field stop region 25 has a concentration of not less than $1 \times 10^{16}$ cm$^{-3}$ and not more than $1 \times 10^{20}$ cm$^{-3}$, for example.

Figure 2:
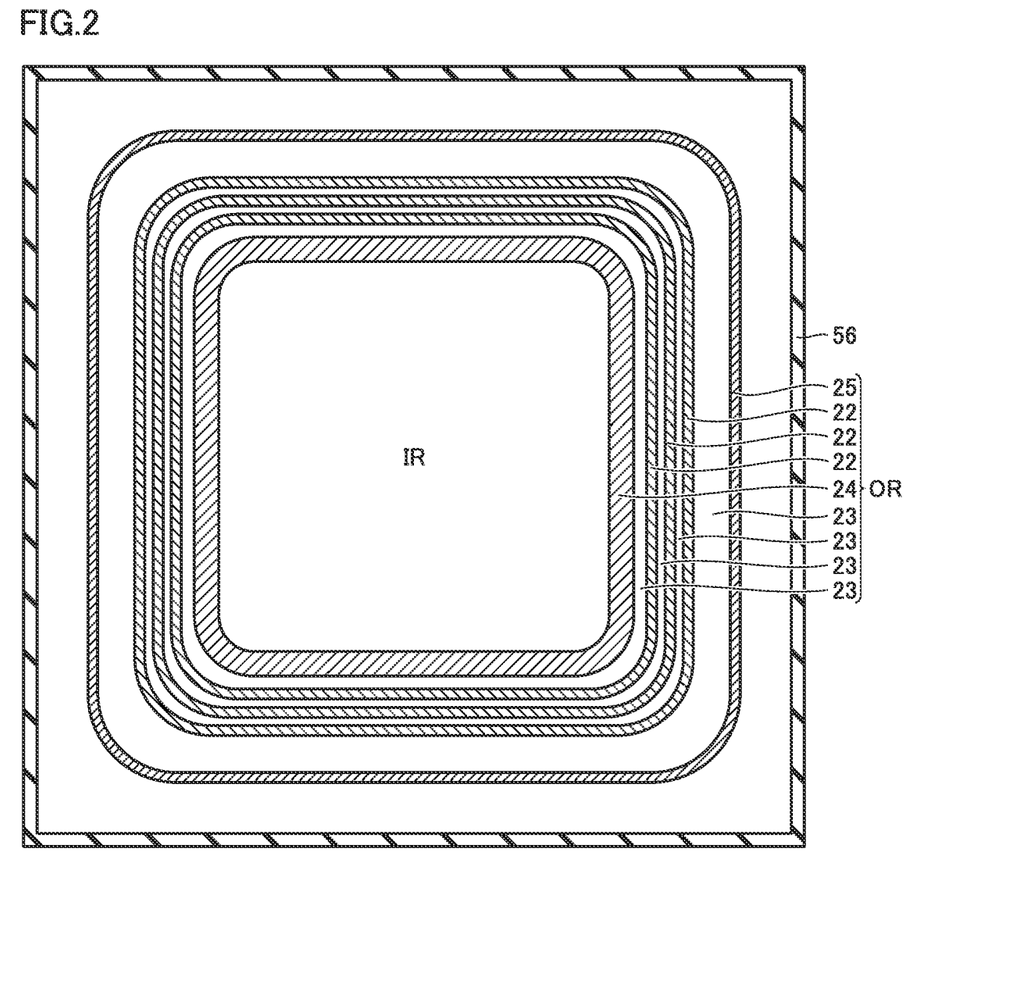
FIG. 2 is a schematic sectional view taken along the line II-II in a direction of arrows in FIG. 1.
Figure 3:
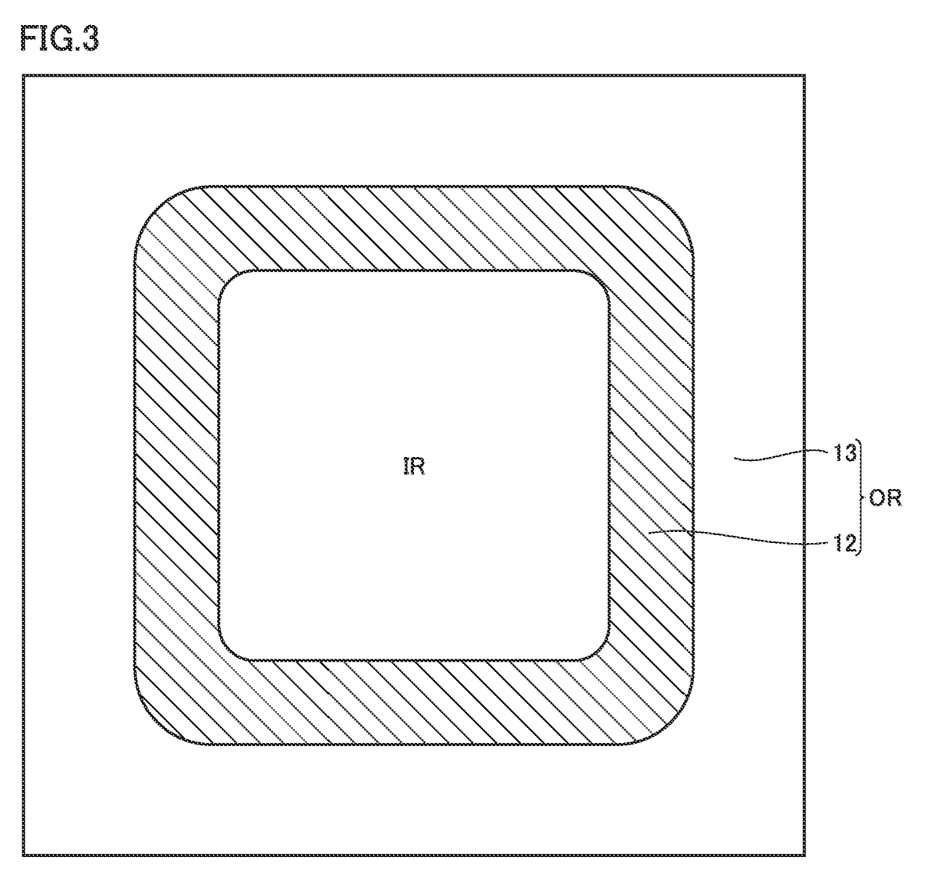
FIG. 3 is a schematic sectional view taken along the line III-III in a direction of arrows in FIG. 1.

As shown in FIGS. 1, 2 and 3, MOSFET 100 is formed of an active region IR and an outer peripheral region OR. As shown in FIGS. 2 and 3, outer peripheral region OR surrounds active region IR. As shown in FIGS. 1 and 2, fourth impurity region 22 surrounds third impurity region 21 and fifth impurity region 24 as seen in a direction perpendicular to first main surface 1. Field stop region 25 surrounds third impurity region 21, fifth impurity region 24 and fourth impurity region 22 as seen in the direction perpendicular to first main surface 1. Second insulating film 56 surrounds third impurity region 21, fourth impurity region 22 and field stop region 25 as seen in the direction perpendicular to first main surface 1. As shown in FIGS. 1 and 3, second impurity region 12 surrounds first impurity region 11 as seen in the direction perpendicular to first main surface 1. The outer edge of a rectangular chip may be formed by first drift region 13.

As shown in FIG. 1, first impurity region 11 is in contact with second impurity region 12. Third impurity region 21 is separated from fourth impurity region 22 by second drift region 23. Second impurity region 12 has a width W1 greater than a width W2 of fourth impurity region 22 in a direction parallel to first main surface 1. Fourth impurity region 22 may include one or more guard rings. Fourth impurity region 22 includes three guard rings 22, for example. There may be two or more guard rings, or four or more guard rings. Width W1 of second impurity region 12 in the direction parallel to first main surface 1 may be two or more times greater than a sum T3 of a thickness T1 of first silicon carbide layer 10 and a thickness T2 of second silicon carbide layer 20. When width W1 is two or more times greater than sum T3 of thickness T1 and thickness T2, electric field concentration can be adequately relaxed in the outer peripheral structure, and the breakdown voltage is significantly improved. Width W1 of second impurity region 12 is a width in a direction perpendicular to the direction in which second impurity region 12 extends. Second impurity region 12 may face each of the plurality of guard rings. Second impurity region 12 may face fifth impurity region 24.

First impurity region 11 may have a thickness greater than or equal to the thickness of second impurity region 12. Third impurity region 21 may have a thickness greater than the thickness of fourth impurity region 22. Third impurity region 21 may have a thickness greater than the thickness of fifth impurity region 24. Field stop region 25 may have a thickness greater than the thickness of fourth impurity region 22. Field stop region 25 may have a thickness smaller than the thickness of third impurity region 21.

Active region IR includes, for example, third impurity region 21, a source region 27, a contact region 26, gate insulating film 52, gate electrode 53, interlayer insulating film 54, source electrode 51, and first impurity region 11. Outer peripheral region OR has, for example, second impurity region 12, fourth impurity region 22, fifth impurity region 24, and field stop region 25. First drift region 13 and second drift region 23 are provided in each of active region IR and outer peripheral region OR, for example. Second silicon carbide layer 20 has a body region 21, source region 27, and contact region 26.

Body region 21 is provided on second drift region 23. Body region 21 includes a p type impurity such as aluminum (Al), and has p type (second conductivity type). The p type impurity in body region 21 has a concentration higher than the concentration of the n type impurity in second drift region 23, for example. Body region 21 may have a thickness greater than the thicknesses of fourth impurity region 22 and fifth impurity region 24. First impurity region 11 may face body region 21 with second drift region 23 interposed therebetween. Body region 21 is a portion of third impurity region 21 that is sandwiched between source region 27 and second drift region 23.

Source region 27 is provided on body region 21 so as to be separated from second drift region 23 by body region 21. Source region 27 includes an n type impurity such as nitrogen (N) or phosphorus (P), and has n type conductivity. Source region 27 constitutes first main surface 1. The n type impurity in source region 27 may have a concentration higher than the concentration of the p type impurity in body region 21. The n type impurity in source region 27 has a concentration of about $2 \times 10^{19}$ cm$^{-3}$, for example.

Contact region 26 includes a p type impurity such as aluminum, and has p type conductivity. The p type impurity in contact region 26 may have a concentration higher than the concentration of the p type impurity in body region 21, for example. Contact region 26 may extend through source region 27 to be in contact with body region 21. Contact region 26 constitutes first main surface 1. The p type impurity in contact region 26 has a concentration of not less than $1 \times 10^{18}$ cm$^{-3}$ and not more than $3 \times 10^{20}$ cm$^{-3}$, for example. When the p type impurity concentration in contact region 26 is less than $1 \times 10^{18}$ cm$^{-3}$, contact resistance will increase to result in poorer switching characteristics. When the p type impurity concentration in contact region 26 exceeds $3 \times 10^{20}$ cm$^{-3}$, the silicon carbide may have poorer crystallinity, causing problems such as drain leakage.

First main surface 1 is provided with a trench TR defined by a side surface SW and a bottom BT. Side surface SW extends through source region 27 and body region 21 to reach second drift region 23. Bottom BT is continuous with side surface SW. Bottom BT is located in second drift region 23. Bottom BT is a plane parallel to second main surface 2, for example. Side surface SW and bottom BT may form an angle of 90°, or greater than 90°. Side surface SW may be inclined relative to a plane perpendicular to first main surface 1. First impurity region 11 may face bottom BT.

Gate insulating film 52 is an oxide film, for example. Gate insulating film 52 is made of a material including silicon dioxide, for example. The gate insulating film is in contact with second drift region 23 at bottom BT. The gate insulating film is in contact with each of source region 27, body region 21 and second drift region 23 at side surface SW. The gate insulating film may be in contact with source region 27 at first main surface 1.

Gate electrode 53 is provided on gate insulating film 52. Gate electrode 53 is made of polysilicon including a conductive impurity, for example. Gate electrode 53 may be partially disposed in trench TR.

Source electrode 51 is provided on first main surface 1. Source electrode 51 is electrically connected to third impurity region 21. Source electrode 51 is in contact with contact region 26, for example. Source electrode 51 may be in direct contact with third impurity region 21, for example. Source electrode 51 is made of a material including Ti, Al and Si, for example.

Drain electrode 50 is in contact with silicon carbide single-crystal substrate 30 at second main surface 2. Drain electrode 50 is electrically connected to first drift region 13. Drain electrode 50 is made of a material including NiSi or TiAlSi, for example.

Interlayer insulating film 54 is provided in contact with gate electrode 53 and gate insulating film 52. Interlayer insulating film 54 is made of a material including silicon dioxide, for example. Interlayer insulating film 54 electrically insulates gate electrode 53 and source electrode 51. Interlayer insulating film 54 may be partially provided in trench TR.

First insulating film 55 is provided on second insulating film 56. First insulating film 55 may be provided on source electrode 51. Second insulating film 56 is provided on first main surface 1. Second insulating film 56 may be in contact with third impurity region 21, fourth impurity region 22, fifth impurity region 24 and second drift region 23 at first main surface 1. Part of second insulating film 56 may fill a groove (dicing line) provided in an outer edge of silicon carbide substrate 40. Second insulating film 56 may face part of first impurity region 11, and second impurity region 12.

Second Embodiment

Next, a configuration of MOSFET 100 as an example of a silicon carbide semiconductor device according to a second embodiment is described. The MOSFET according to the second embodiment is different from the MOSFET according to the first embodiment mainly in the following configuration, and otherwise similar to the MOSFET according to the first embodiment.

Figure 4:
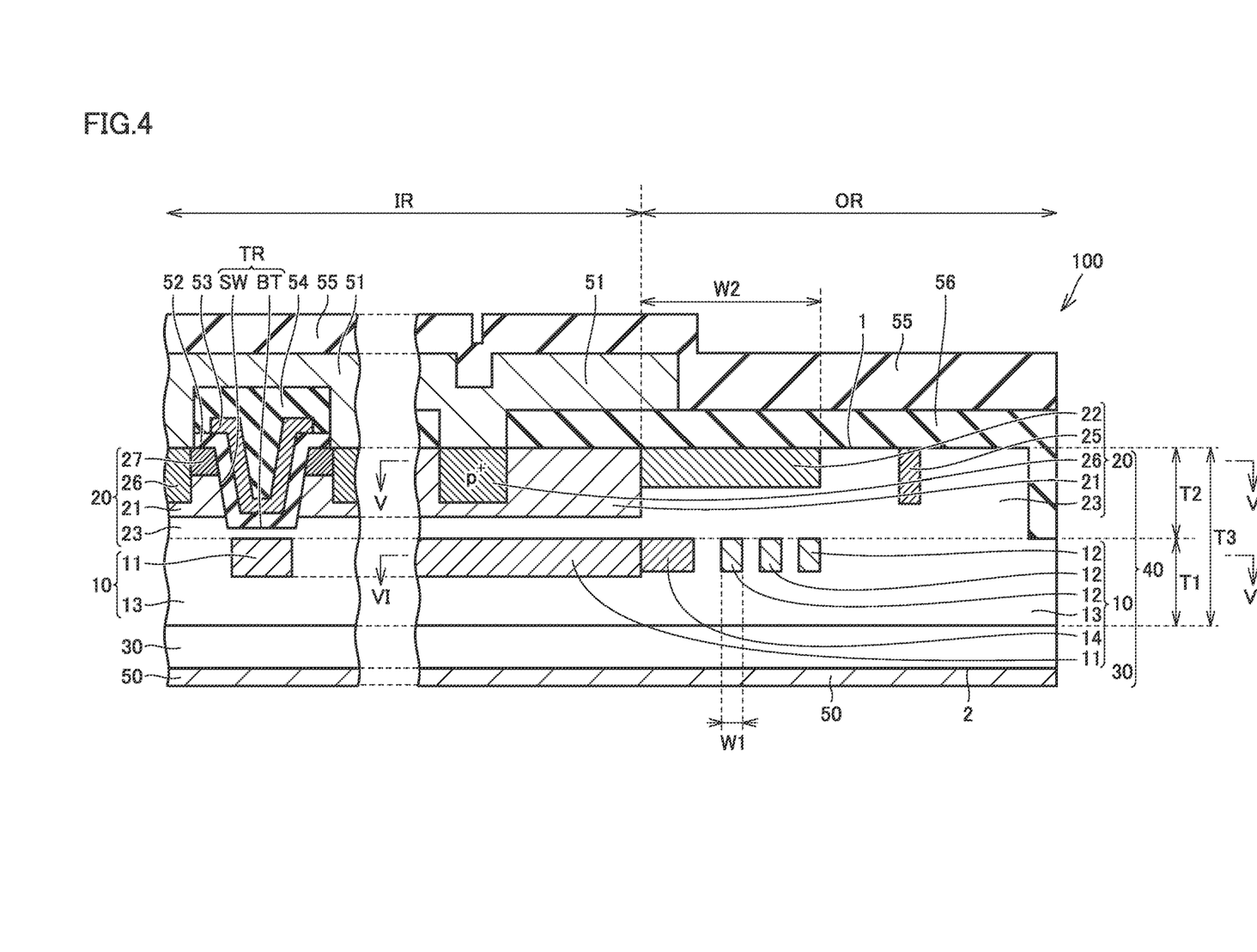
FIG. 4 is a schematic sectional view showing a configuration of a silicon carbide semiconductor device according to a second embodiment.

As shown in FIG. 4, first impurity region 11 may be separated from second impurity region 12 by first drift region 13. In this case, third impurity region 21 is in contact with fourth impurity region 22. First silicon carbide layer 10 has first drift region 13, first impurity region 11, second impurity region 12, and a sixth impurity region 14. Second silicon carbide layer 20 has second drift region 23, third impurity region 21, fourth impurity region 22, and field stop region 25. Sixth impurity region 14 includes a p type impurity such as aluminum (Al) or boron (B), and has p type. The p type impurity in sixth impurity region 14 may have a concentration equal to or different from a concentration of the p type impurity in second impurity region 12. Sixth impurity region 14 is in contact with first impurity region 11.

Fourth impurity region 22 has width W2 greater than width W1 of second impurity region 12 in the direction parallel to first main surface 1. Second impurity region 12 may include one or more guard rings. Width W2 of fourth impurity region 22 in the direction parallel to first main surface 1 may be two or more times greater than sum T3 of thickness T1 of first silicon carbide layer 10 and thickness T2 of second silicon carbide layer 20. When width W2 is two or more times greater than sum T3 of thickness T1 and thickness T2, electric field concentration can be adequately relaxed in the outer peripheral structure, and the breakdown voltage is significantly improved. Width W2 of fourth impurity region 22 is a width in a direction perpendicular to the direction in which fourth impurity region 22 extends. Fourth impurity region 22 may face each of the plurality of guard rings 12. Fourth impurity region 22 may face sixth impurity region 14.

First impurity region 11 may have a thickness greater than or equal to the thickness of second impurity region 12. First impurity region 11 may have a thickness greater than or equal to the thickness of sixth impurity region 14. Third impurity region 21 may have a thickness greater than the thickness of fourth impurity region 22. Field stop region 25 may have a thickness greater than the thickness of fourth impurity region 22. Field stop region 25 may have a thickness smaller than the thickness of third impurity region 21.

First impurity region 11 may be floating, for example. First impurity region 11 may be electrically insulated from source electrode 51. Conversely, first impurity region 11 may be electrically connected to source electrode 51. First impurity region 11 is preferably connected to source electrode 51 with a p type impurity region (not shown) interposed therebetween, for example, so as to further improve the breakdown voltage of the outer peripheral structure. Second impurity region 12 may be floating, for example. Second impurity region 12 may be electrically insulated from source electrode 51. Conversely, second impurity region 12 may be electrically connected to source electrode 51. Second impurity region 12 is preferably connected to source electrode 51 with first impurity region 11 interposed therebetween, so as to further improve the breakdown voltage of the outer peripheral structure. The dose amount of the p type impurity (second conductivity type impurity) in fourth impurity region 22 is not less than $0.4 \times 10^{13}$ cm$^{-2}$ and not more than $2.0 \times 10^{13}$ cm$^{-2}$, for example. The dose amount of the p type impurity (second conductivity type impurity) in second impurity region 12 is not less than $0.4 \times 10^{13}$ cm$^{-2}$ and not more than $2.0 \times 10^{13}$ cm$^{-2}$, for example.

Figure 5:
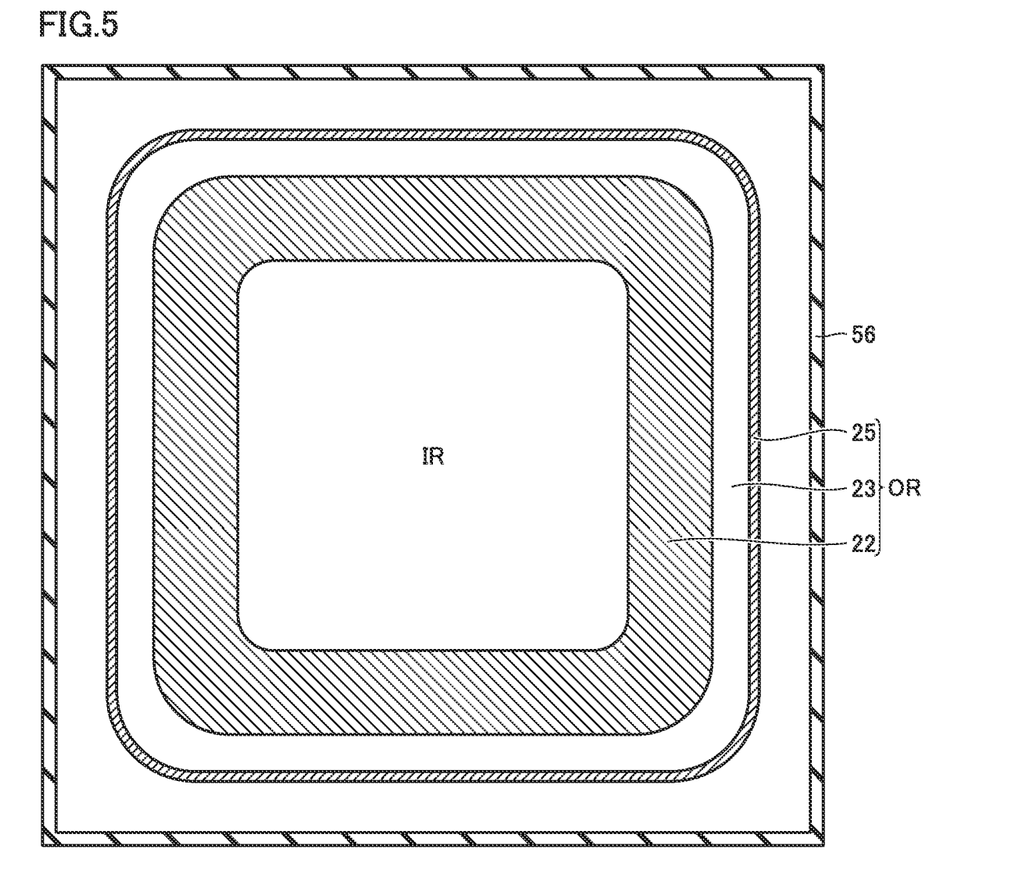
FIG. 5 is a schematic sectional view taken along the line V-V in a direction of arrows in FIG. 4.

As shown in FIGS. 4 and 5, fourth impurity region 22 surrounds third impurity region 21 as seen in the direction perpendicular to first main surface 1. Field stop region 25 surrounds third impurity region 21 and fourth impurity region 22 as seen in the direction perpendicular to first main surface 1. Second insulating film 56 surrounds third impurity region 21, fourth impurity region 22 and field stop region 25 as seen in the direction perpendicular to first main surface 1.

Figure 6:
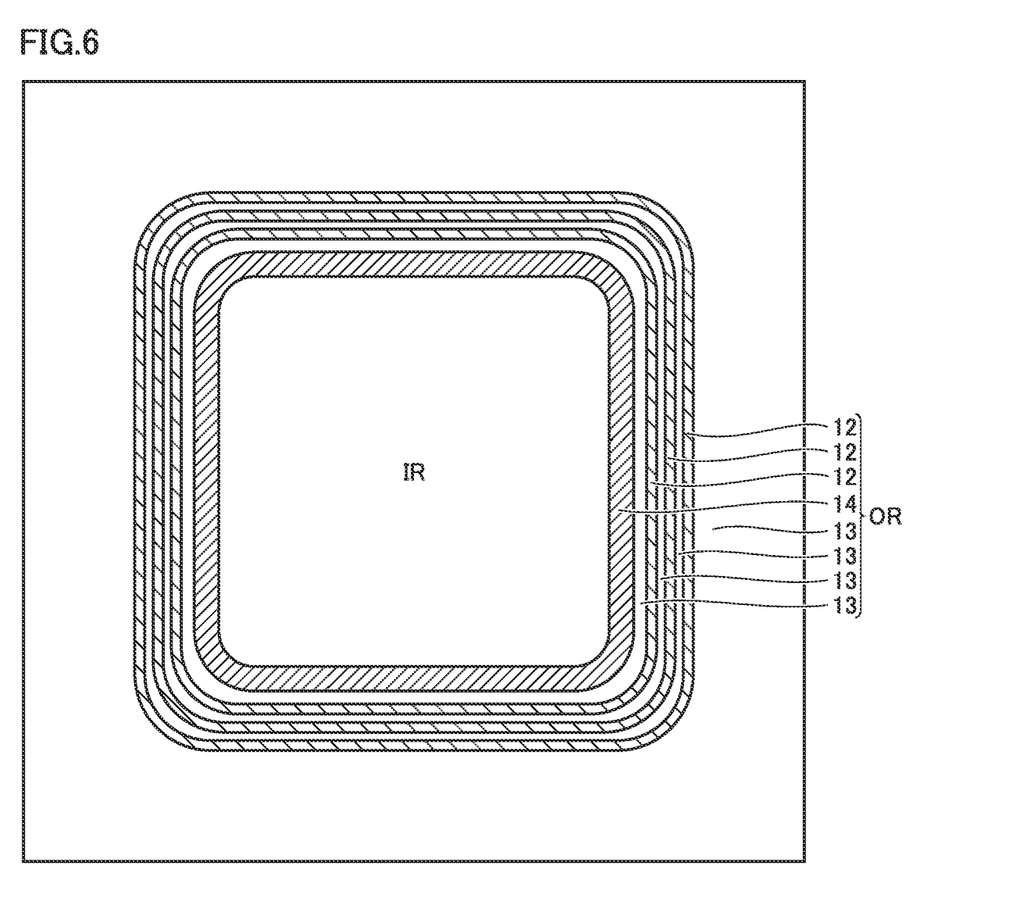
FIG. 6 is a schematic sectional view taken along the line VI-VI in a direction of arrows in FIG. 4.

As shown in FIGS. 4 and 6, second impurity region 12 surrounds first impurity region 11 and sixth impurity region 14 as seen in the direction perpendicular to first main surface 1. Second impurity region 12 has the plurality of guard rings 12, for example. First drift region 13 is disposed between two adjacent ones of guard rings 12. The outer edge of a rectangular chip may be formed by first drift region 13.

The concentration of the p type impurity and the concentration of the n type impurity in each impurity region described above can be measured, for example, with a SCM (Scanning Capacitance Microscope), SIMS (Secondary Ion Mass Spectrometry), or the like.

Although n type has been described as the first conductivity type and p type has been described as the second conductivity type in the embodiment, p type may be the first conductivity type and n type may be the second conductivity type. Although a MOSFET has been described as an example of the silicon carbide semiconductor device in the embodiment, the silicon carbide semiconductor device may be, for example, an IGBT (Insulated Gate Bipolar Transistor) or the like.

Next, a function and effect of the MOSFET according to the embodiment will be described.

According to MOSFET 100 in the embodiment, the voltage is distributed throughout the outer peripheral structure (second impurity region 12 and fourth impurity region 22). Thus, the breakdown voltage can be maintained over a wide range of impurity concentration. In other words, variation in the breakdown voltage can be suppressed.

According to MOSFET 100 in the embodiment, silicon carbide substrate 40 may have the first structure. Thereby, variation in the breakdown voltage can be suppressed.

Moreover, according to MOSFET 100 in the embodiment, fourth impurity region 22 may include one or more guard rings. Thereby, the voltage is further distributed throughout the outer peripheral structure.

Moreover, according to MOSFET 100 in the embodiment, fourth impurity region 22 may be floating. Thereby, the voltage is further distributed throughout the outer peripheral structure.

Moreover, according to MOSFET 100 in the embodiment, silicon carbide substrate 40 may have the second structure. Thereby, variation in the breakdown voltage can be suppressed.

Moreover, according to MOSFET 100 in the embodiment, second impurity region 12 may include one or more guard rings. Thereby, the voltage is further distributed throughout the outer peripheral structure.

Moreover, according to MOSFET 100 in the embodiment, second impurity region 12 may be floating. Thereby, the voltage is further distributed throughout the outer peripheral structure.

Moreover, according to MOSFET 100 in the embodiment, the first conductivity type impurity in first drift region 13 may have a concentration of not less than $5 \times 10^{13}$ cm$^{-3}$ and not more than $1 \times 10^{16}$ cm$^{-3}$. Thereby, the breakdown voltage can be maintained at high level while the on-resistance is kept at low level.

Moreover, according to MOSFET 100 in the embodiment, the first conductivity type impurity in second drift region 23 may have a concentration of not less than $5 \times 10^{15}$ cm$^{-3}$ and not more than $1 \times 10^{18}$ cm$^{-3}$. The on-resistance tends to decrease, however, the breakdown voltage tends to decrease, as the concentration of the first conductivity type impurity in second drift region 23 is increased. According to MOSFET 100 in the embodiment, the breakdown voltage can be maintained at high level while the on-resistance is kept at low level.

Example

First, simulation models of MOSFETs according to samples 1 to 3 were prepared. The MOSFET according to sample 1 had three guard ring structures (embedded GRs) in first silicon carbide layer 10, and three guard ring structures (surface GRs) in second silicon carbide layer 20. The MOSFET according to sample 2 had three guard ring structures (embedded GRs) in first silicon carbide layer 10, and a JTE structure (surface JTE) in second silicon carbide layer 20 (second embodiment). The MOSFET according to sample 3 had a JTE structure (embedded JTE) in first silicon carbide layer 10, and three guard ring structures (surface GRs) in second silicon carbide layer 20 (first embodiment).

The breakdown voltage of the MOSFET according to each sample was calculated through simulation while the dose amount in surface GRs and surface JTE in second silicon carbide layer 20 was varied. In this simulation, the dose amount in embedded GRs and embedded JTE in first silicon carbide layer 10 was $1.4 \times 10^{13}$ cm$^{-2}$. First drift region 13 had an n type impurity concentration of $7.0 \times 10^{15}$ cm$^{-3}$, and second drift region 23 had an n type impurity concentration of $5.0 \times 10^{16}$ cm$^{-3}$.

Figure 7:
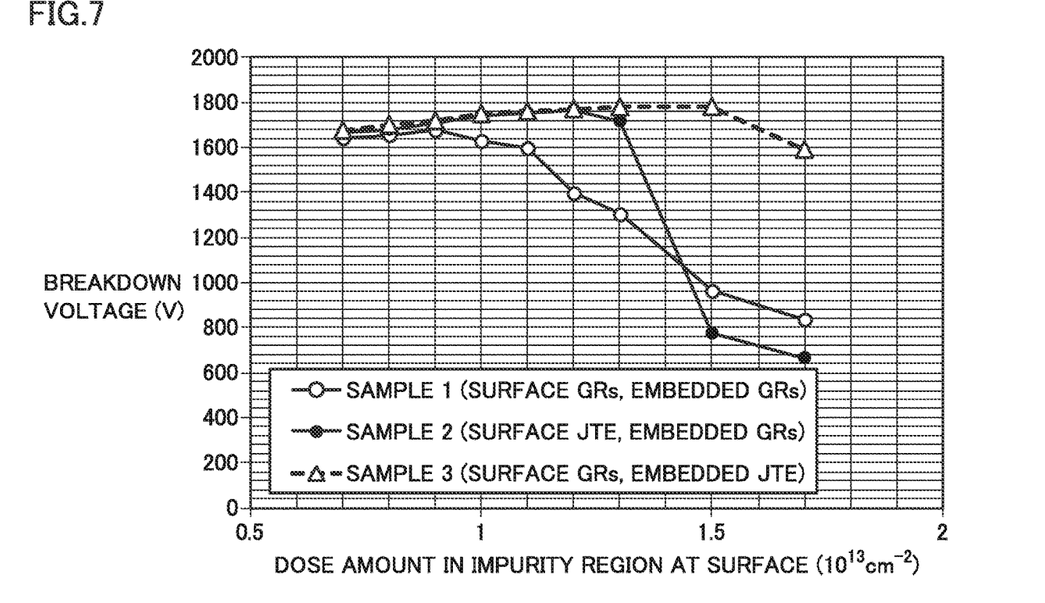
FIG. 7 shows relation between breakdown voltage and a dose amount in a termination structure at a surface.

As shown in FIG. 7, the MOSFETs according to samples 2 and 3 have higher maximum breakdown voltages than the maximum breakdown voltage of the MOSFET according to sample 1. In the MOSFET according to sample 1, the breakdown voltage decreases significantly when the dose amount in surface GRs exceeds $0.9 \times 10^{13}$ cm$^{-2}$. In the MOSFETs according to samples 2 and 3, on the other hand, the breakdown voltage is substantially constant when the dose amount in surface JTE and surface GRs is within the range of not less than $0.9 \times 10^{13}$ cm$^{-2}$ and not more than $1.2 \times 10^{13}$ cm$^{-2}$. In other words, in the MOSFETs according to samples 2 and 3, it is possible to suppress increase in breakdown voltage variation even if the dose amount in surface GRs and surface JTE varies in the manufacturing process.

Figure 8:
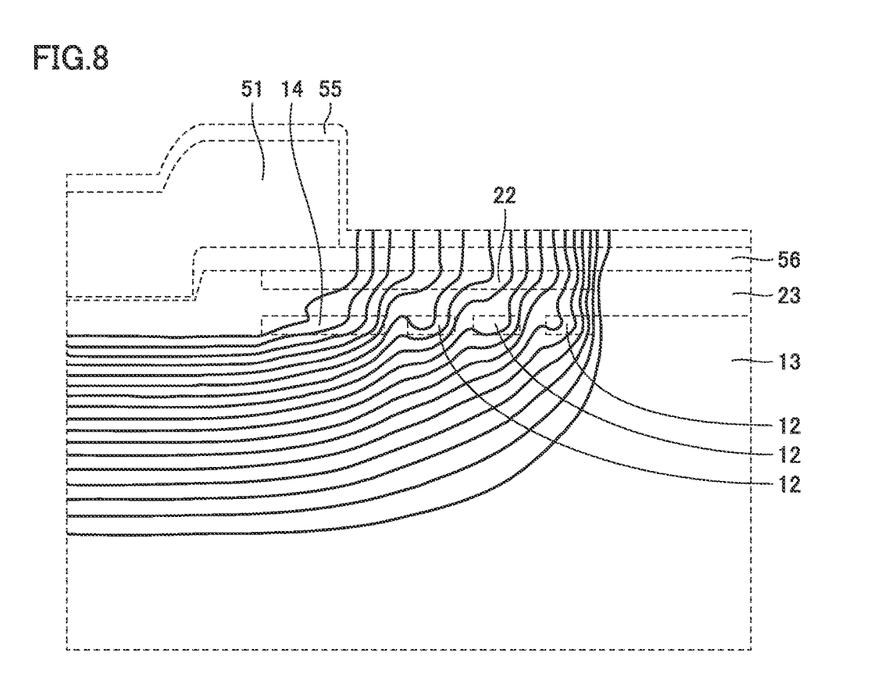
FIG. 8 shows distribution of an equipotential surface in a MOSFET according to a sample 2 when the dose amount is $1.1 \times 10^{13}$ cm$^{-2}$.

FIG. 8 shows distribution of an equipotential surface in the MOSFET according to sample 2 when the dose amount is $1.1 \times 10^{13}$ cm$^{-2}$. It should be noted that the equipotential surface represents 100 V per line in FIGS. 8 to 12. As shown in FIG. 8, it is believed that the breakdown voltage increases in the MOSFET according to sample 2 because the voltage is applied throughout the outer peripheral structure in a distributed manner.

Figure 9:
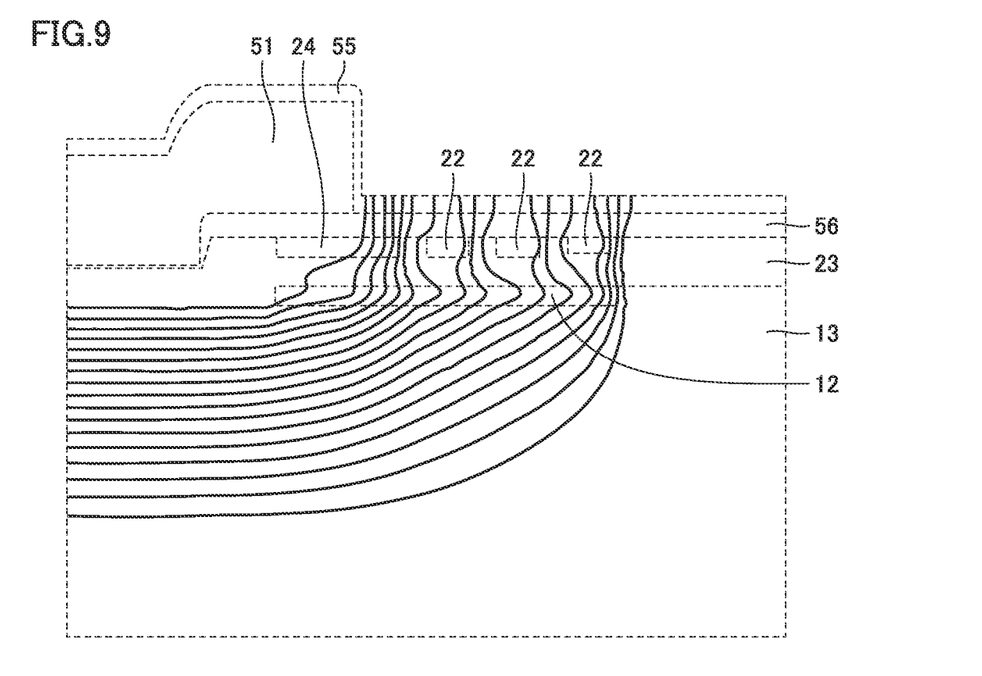
FIG. 9 shows distribution of an equipotential surface in a MOSFET according to a sample 3 when the dose amount is $1.1 \times 10^{13}$ cm$^{-2}$.

FIG. 9 shows distribution of an equipotential surface in the MOSFET according to sample 3 when the dose amount is $1.1 \times 10^{13}$ cm$^{-2}$. As shown in FIG. 9, it is believed that the breakdown voltage increases in the MOSFET according to sample 3 because the voltage is applied throughout the outer peripheral structure in a distributed manner.

Figure 10:
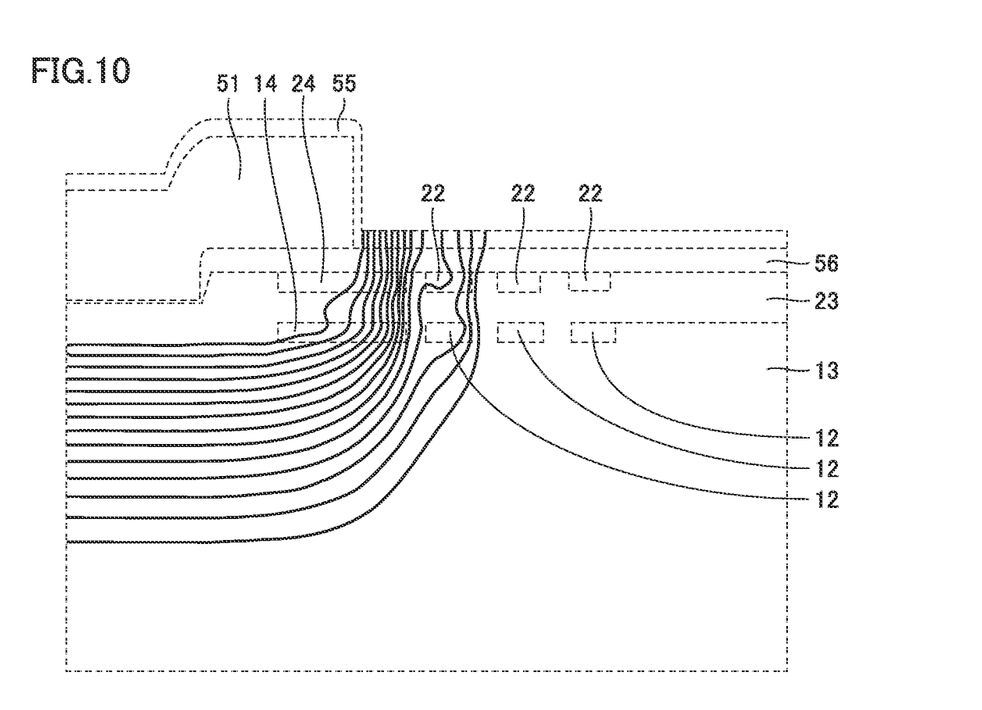
FIG. 10 shows distribution of an equipotential surface in a MOSFET according to a sample 1 when the dose amount is $1.1 \times 10^{13}$ cm$^{-2}$.

FIG. 10 shows distribution of an equipotential surface in the MOSFET according to sample 1 when the dose amount is $1.1 \times 10^{13}$ cm$^{-2}$. As shown in FIG. 9, in the MOSFET according to sample 1, the equipotential surface is concentrated near the circumferentially innermost guard ring, and thus the voltage is not applied throughout the outer peripheral structure in a distributed manner. This is believed to be the reason that the breakdown voltage decreases.

Figure 11:
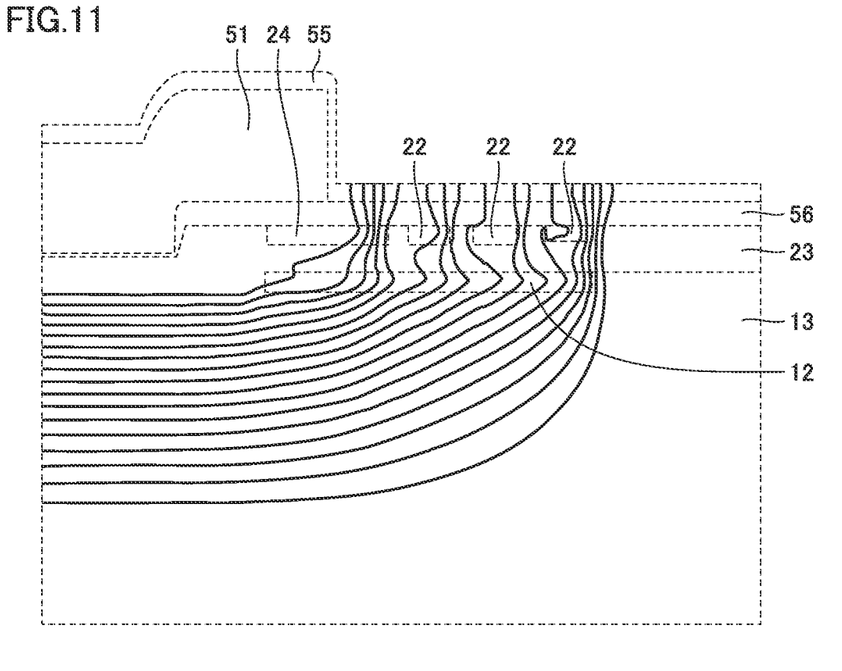
FIG. 11 shows distribution of an equipotential surface in the MOSFET according to sample 3 when the dose amount is $1.5 \times 10^{13}$ cm$^{-2}$.

FIG. 11 shows distribution of an equipotential surface in the MOSFET according to sample 3 when the dose amount is $1.5 \times 10^{13}$ cm$^{-2}$. As shown in FIG. 11, it is believed that the breakdown voltage increases in the MOSFET according to sample 3 because the voltage is applied throughout the outer peripheral structure in a distributed manner. Specifically, it is believed that the drift region can always be depleted because embedded JTE has an optimal dose amount. The breakdown voltage thereby increases. It is also believed that, because surface GRs distribute the equipotential surface, the breakdown voltage can be further increased, and the high breakdown voltage can be maintained over a wide range of dose amount in the GR structures.

Figure 12:
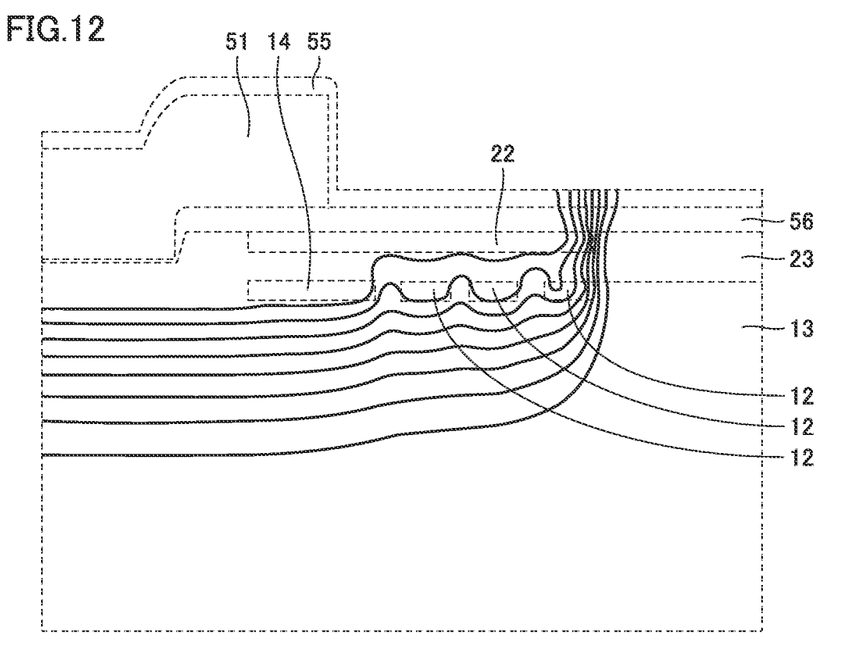
FIG. 12 shows distribution of an equipotential surface in the MOSFET according to sample 2 when the dose amount is $1.5 \times 10^{13}$ cm$^{-2}$.

FIG. 12 shows distribution of an equipotential surface in the MOSFET according to sample 2 when the dose amount is $1.5 \times 10^{13}$ cm$^{-2}$. As shown in FIG. 12, in the MOSFET according to sample 2, when the dose amount in surface JTE is increased, surface JTE is not depleted, thus causing the equipotential surface to be concentrated on the outer peripheral end of the JTE. This is believed to be the reason that the breakdown voltage decreases significantly.

From the results above, it was determined that, in the MOSFETs according to samples 2 and 3, it was possible to suppress variation in the breakdown voltage when the dose amount is varied. It was also determined that, in the MOSFET according to sample 3, it was possible to suppress variation in the breakdown voltage over a wider range of dose amount. The simulation in the present disclosure was based on the assumption that the maximum breakdown voltage was between 1700 V and 1800 V, with 1200 V being the breakdown voltage specification. However, the configuration of the present disclosure is also applicable to a power device having a breakdown voltage specification of about 3300 V or 6500 V by reducing the impurity concentrations in first silicon carbide layer 10 and second silicon carbide layer 20, increasing the thicknesses of first silicon carbide layer 10 and second silicon carbide layer 20, increasing the width of outer peripheral region OR, and the like. Assuming that the breakdown voltage specification is 3300 V, for example, the configuration is applicable to a power device of 3300 V by setting the thickness of first silicon carbide layer 10 to about 30 μm, and setting the impurity concentration in first silicon carbide layer 10 to about $3.0 \times 10^{15}$ cm$^{-3}$. In other words, the configuration of the present disclosure is applicable to a variety of breakdown voltage specifications.

It should be understood that the embodiment and example disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 1 first main surface; 2 second main surface; 10 first silicon carbide layer; 11 first impurity region; 12 second impurity region (guard ring); 13 first drift region; 14 sixth impurity region; 20 second silicon carbide layer; 21 third impurity region (body region); 22 fourth impurity region (guard ring); 23 second drift region; 24 fifth impurity region; 25 field stop region; 26 contact region; 27 source region; 30 single-crystal substrate; 40 silicon carbide substrate; 50 drain electrode; 51 source electrode; 52 gate insulating film; 53 gate electrode; 54 interlayer insulating film; 55 first insulating film; 56 second insulating film; 100 silicon carbide semiconductor device (MOSFET); BT bottom; IR active region; OR outer peripheral region; SW side surface; T1, T2 thickness; T3 sum; TR trench; W1, W2 width.

The invention claimed is:

1. A silicon carbide semiconductor device comprising:
a silicon carbide substrate having a first main surface and a second main surface opposite to the first main surface; and
a source electrode provided on the first main surface,
the silicon carbide substrate including a first silicon carbide layer, and a second silicon carbide layer provided on the first silicon carbide layer and constituting the first main surface,
the first silicon carbide layer having
a first drift region having a first conductivity type,
a first impurity region having a second conductivity type different from the first conductivity type, and
a second impurity region having the second conductivity type and surrounding the first impurity region as seen in a direction perpendicular to the first main surface,
the second silicon carbide layer having
a second drift region having the first conductivity type,
a third impurity region having the second conductivity type and facing the first impurity region with the second drift region interposed therebetween, and
a fourth impurity region having the second conductivity type, facing the second impurity region with the second drift region interposed therebetween, and surrounding the third impurity region as seen in the direction perpendicular to the first main surface,
a first conductivity type impurity in the second drift region having a concentration higher than a concentration of a first conductivity type impurity in the first drift region,
the third impurity region being electrically connected to the source electrode,
the silicon carbide substrate having at least one of a first structure and a second structure,
the first structure being such that the first impurity region is in contact with the second impurity region, the third impurity region is separated from the fourth impurity region by the second drift region, and the second impurity region has a width greater than a width of the fourth impurity region in a direction parallel to the first main surface, and
the second structure being such that the first impurity region is separated from the second impurity region by the first drift region, the third impurity region is in contact with the fourth impurity region, and the fourth impurity region has a width greater than a width of the second impurity region in the direction parallel to the first main surface.

2. The silicon carbide semiconductor device according to claim 1, wherein
the silicon carbide substrate has the first structure.

3. The silicon carbide semiconductor device according to claim 2, wherein
the fourth impurity region includes one or more guard rings.

4. The silicon carbide semiconductor device according to claim 2, wherein
the width of the second impurity region in the direction parallel to the first main surface is two or more times greater than a sum of a thickness of the first silicon carbide layer and a thickness of the second silicon carbide layer.

5. The silicon carbide semiconductor device according to claim 2, wherein
the fourth impurity region is floating.

6. The silicon carbide semiconductor device according to claim 2, wherein
the first impurity region is floating.

7. The silicon carbide semiconductor device according to claim 2, wherein
the first impurity region is electrically connected to the source electrode.

8. The silicon carbide semiconductor device according to claim 2, wherein
each of the first impurity region, the second impurity region and the fourth impurity region is electrically connected to the source electrode.

9. The silicon carbide semiconductor device according to claim 2, wherein
a dose amount of a second conductivity type impurity in the second impurity region is not less than $0.4 \times 10^{13}$ cm$^{-2}$ and not more than $2.0 \times 10^{13}$ cm$^{-2}$.

10. The silicon carbide semiconductor device according to claim 2, wherein
a dose amount of a second conductivity type impurity in the fourth impurity region is not less than $0.4 \times 10^{13}$ cm$^{-2}$ and not more than $2.0 \times 10^{13}$ cm$^{-2}$.

11. The silicon carbide semiconductor device according to claim 1, wherein
the silicon carbide substrate has the second structure.

12. The silicon carbide semiconductor device according to claim 11, wherein
the second impurity region includes one or more guard rings.

13. The silicon carbide semiconductor device according to claim 11, wherein
the width of the fourth impurity region in the direction parallel to the first main surface is two or more times greater than a sum of a thickness of the first silicon carbide layer and a thickness of the second silicon carbide layer.

14. The silicon carbide semiconductor device according to claim 11, wherein
the second impurity region is floating.

15. The silicon carbide semiconductor device according to claim 11, wherein
the first impurity region is floating.

16. The silicon carbide semiconductor device according to claim 11, wherein
the first impurity region is electrically connected to the source electrode.

17. The silicon carbide semiconductor device according to claim 11, wherein
   each of the first impurity region and the second impurity region is electrically connected to the source electrode.

18. The silicon carbide semiconductor device according to claim 11, wherein
   a dose amount of a second conductivity type impurity in the fourth impurity region is not less than $0.4\times10^{13}$ cm$^{-2}$ and not more than $2.0\times10^{13}$ cm$^{-2}$.

19. The silicon carbide semiconductor device according to claim 11, wherein
   a dose amount of a second conductivity type impurity in the second impurity region is not less than $0.4\times10^{13}$ cm$^{-2}$ and not more than $2.0\times10^{13}$ cm$^{-2}$.

20. The silicon carbide semiconductor device according to claim 1, wherein
   the first conductivity type impurity in the first drift region has a concentration of not less than $5\times10^{13}$ cm$^{-3}$ and not more than $1\times10^{16}$ cm$^{-3}$.

21. The silicon carbide semiconductor device according to claim 1, wherein
   the first conductivity type impurity in the second drift region has a concentration of not less than $5\times10^{15}$ cm$^{-3}$ and not more than $1\times10^{18}$ cm$^{-3}$.

* * * * *